United States Patent
Zhang

[11] Patent Number: 5,847,599
[45] Date of Patent: Dec. 8, 1998

[54] STABLE FAST SETTLING SENSE AMPLIFIER

[75] Inventor: Tao Zhang, Fremont, Calif.

[73] Assignee: OmniVision Technologies Inc., San Jose, Calif.

[21] Appl. No.: 612,232

[22] Filed: Mar. 7, 1996

[51] Int. Cl.⁶ .............................. H03F 1/02; H03F 1/14
[52] U.S. Cl. .............................. 330/9; 330/51; 330/292
[58] Field of Search .................... 327/554; 330/9, 330/51, 107, 109, 292

[56] References Cited

U.S. PATENT DOCUMENTS

| | | | |
|---|---|---|---|
| 4,565,971 | 1/1986 | Brookshire | 330/9 |
| 4,714,843 | 12/1987 | Smith | 330/9 X |

FOREIGN PATENT DOCUMENTS 62-51312  3/1987  Japan ..................... 327/554

*Primary Examiner*—Steven Mottola
*Attorney, Agent, or Firm*—Christensen O'Connor Johnson & Kindness

[57] ABSTRACT

An amplifier for use in a MOS sensing array is disclosed. The amplifier includes an operational amplifier and a feedback capacitor. During an equalization period, the voltage between the output of the operational amplifier and the inverting input is equalized. During an amplification period, an input signal is applied and amplified by the combination of the operational amplifier and the feedback capacitor. Additionally, during the amplification period, the compensation capacitor of the operational amplifier is disabled.

3 Claims, 2 Drawing Sheets

STABLE FAST SETTLING SENSE AMPLIFIER

FIELD OF THE INVENTION

The present invention relates to metal oxide semiconductor (MOS) imaging arrays, and more particularly, an improved amplifier for MOS imaging arrays.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low cost and small hand-held video cameras. Nevertheless, the solid-state CCD integrated circuits needed for imaging are relatively difficult to manufacture, and therefore are expensive. In addition, because of the differing processes involved in the manufacture of CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

An alternative low cost technology to CCD integrated circuits is the metal oxide semiconductor (MOS) integrated circuit. Not only are imaging devices using MOS technology less expensive to manufacture relative the CCD imaging devices, for certain applications MOS devices are superior in performance. For example, the pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

Examples of MOS imaging devices are detailed in "A ¼ Inch Format 250K Pixel Amplified MOS Image Sensor Using CMOS Process" by Kawashima et al., *IEDM* 93–575 (1993), and "A Low Noise Line-Amplified MOS Imaging Devices" by Ozaki et al., *IEEE Transactions on Electron Devices*, Vol. 38, No. 5, May 1991. In addition, U.S. Pat. No. 5,345,266 to Denyer titled "Matrix Array Image Sensor Chip" describes a MOS image sensor. The devices disclosed in these publications provide a general design approach to MOS imaging devices.

The primary building block of an image formed by an MOS imaging device is a pixel. The number, size and spacing of the pixels determine the resolution of the image generated by the imaging device. The pixels of a MOS imaging device are semiconductor devices that transform incident light photons into current signals. The signal produced by each pixel is generally extremely small, in the nanoampere range. This small signal is unsuitable for further processing. Thus, a critical requirement of a MOS image sensor is the ability to amplify the signal from the individual pixels to a suitable level for further processing.

In addition, in most MOS imaging arrays, there are a large number of pixels. For example, the imaging array may include 320 columns by 240 rows, resulting in 76,800 pixels. Moreover, for various television standards, the entire array may have to be read many times per second. Thus, one important requirement is that the circuitry that acquires and amplifies the signal must perform these tasks rapidly and accurately.

SUMMARY OF THE INVENTION

The present invention discloses an improved amplifier for use in a MOS imaging sensor. The amplifier comprises an operational amplifier having a negative input, an output, and a compensation capacitor, a feedback capacitor coupled between said negative input and said output, a first switch connected between said negative input and said output, a second switch between said output and a final output terminal, a third switch for selectively disabling said compensation capacitor, a fourth switch for selectively providing said input signal to said negative input; and a timing circuit operative in an equalization period to activate said first switch to bypass said feedback capacitor and said third switch to engage said compensation capacitor, said timing circuit operative in an amplification period to allow said input signal to be amplified by said operational amplifier with said compensation capacitor disengaged.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
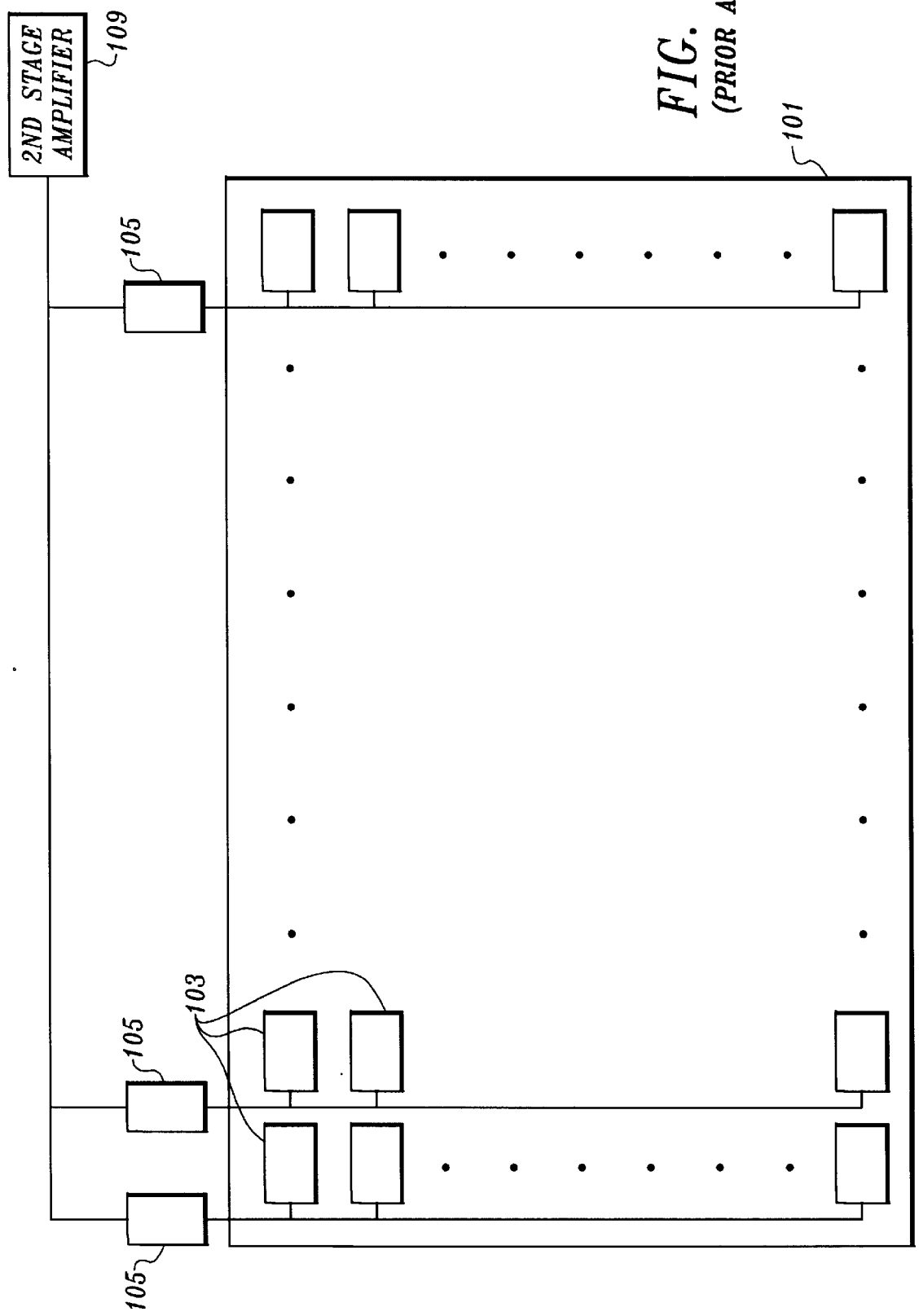
FIG. 1 is a schematic diagram of a CMOS imaging sensor.

With reference to FIG. 1, an architecture for a CMOS imaging array 101 includes a rectangular matrix of pixels 103. The number of pixels in the horizontal or x-direction, and the number of pixels in the vertical or y-direction, constitutes the resolution of the imaging array 101. Each of the pixels 103 in a vertical column routes its signal to a single charge amplifier 105.

The retrieval of information from the pixels 105 follows the well known raster scanning technique. In particular, a row of pixels 105 is scanned sequentially from left to right. The next row is then scanned in this manner until all rows have been scanned sequentially from top to bottom. At the end of each complete scan of the entire array 101, a vertical blanking period of predetermined time occurs until the raster scanning pattern is repeated. This type of scanning follows the NTSC scanning scheme. Control circuitry of conventional design is operative to sequentially read the pixels 103 in this manner.

As each pixel is scanned, the signal from that pixel is provided to the charge amplifier 105 for that column. Thus, the charge amplifiers 105 receive signals sequentially. The sequential signals from the charge amplifiers 105 are then forwarded to a second-stage amplifier 109, which amplifies the signals so that they may be further processed.

As noted above, fast amplifiers 105 and 109 that can quickly amplify the input signal is required. As an example, the NTSC standards for television require a 60 Hz refresh rate for the entire imaging array. In other words, all of the pixels 103 in the array 101 must be scanned 60 times a second. In the preferred embodiment, where the array 101 is 320 columns by 240 rows, the array 101 has 76,800 pixels. At a rate of 60 Hz, each second, information from 4,608,000 pixels must be read and amplified by second-stage amplifier 109. Thus, each pixel 103 must be read and amplified in approximately 217 nanoseconds or 0.217 microseconds.

Because most of the prior art MOS designs for second-stage amplifier 109 use capacitances to perform the amplification, the second-stage amplifier 109 often times cannot perform the full amplification within the allotted time. It can be appreciated by those skilled in the art that capacitances require a finite, often unacceptably lengthy, amount of time to "charge up" to their nominal value. In prior art approaches, the amplification of the signal is abbreviated due to time constraints. This has the disadvantage of lowering the signal to noise ratio of the system. In other prior art systems, to increase the speed of amplification, increased current is used to drive the amplifier. This has the disadvantage of increased power consumption. Thus, there is a need to have charge amplifiers 105 and second stage amplifier 109 perform the amplification as quickly as possible.

Figure 2:
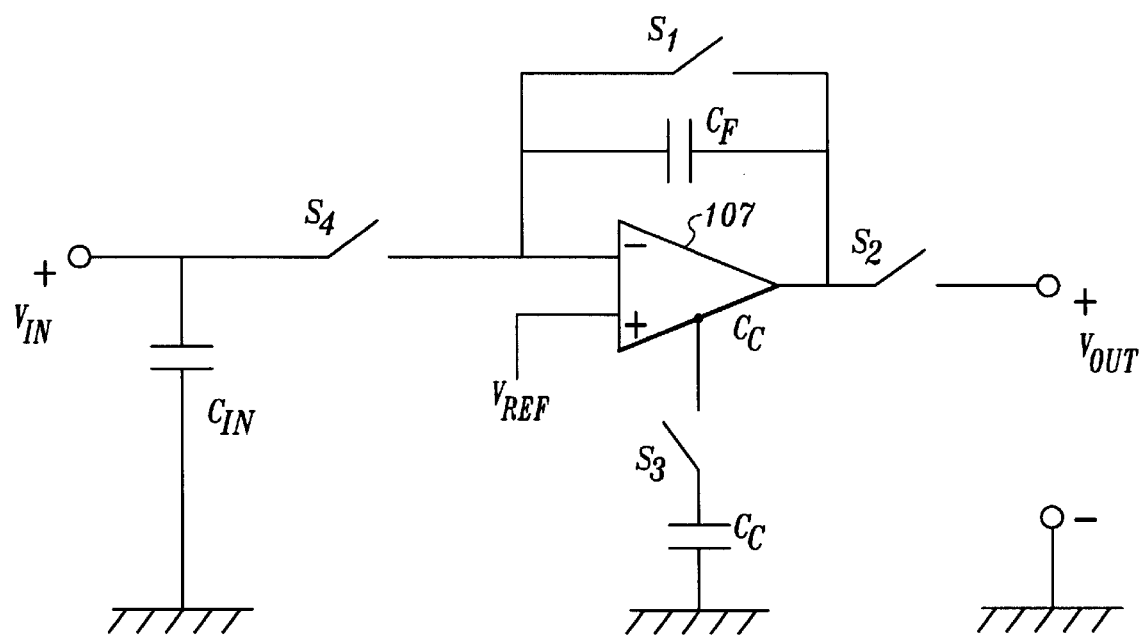
FIG. 2 is a schematic diagram of an amplifier formed in accordance with the present invention.

Turning next to FIG. 2, a second-stage amplifier 109 formed in accordance with the present invention is shown. The charge amplifier 109 includes an operational amplifier 107, a feedback capacitor $C_F$, an input capacitor $C_{IN}$, and switches $S_1$–$S_4$. Also shown is a frequency compensation capacitor $C_C$. The frequency compensation capacitor $C_C$ is not an additional element of the charge amplifier 109, but rather a component of operational amplifier 107 that has been "drawn outside" of the operational amplifier 107. It can be appreciated by those skilled in the art that the typical operational amplifier 107 includes a frequency compensation capacitor $C_C$. The purpose of the frequency compensation capacitor $C_C$ in an operational amplifier is to prevent the operational amplifier 107 from oscillating when connected in a feedback loop.

As seen in FIG. 2, feedback capacitor $C_F$ is connected between the output of the operational amplifier 107 and the inverting input of the operational amplifier. Switch $S_1$ also is connected between the output of the operational amplifier 107 and the inverting input. Thus, switch $S_1$ allows the feedback capacitor $C_F$ to be bypassed.

Switch $S_2$ is placed between the output of the operational amplifier 107 and $V_{OUT}$. Switch $S_3$ is placed between the compensation capacitor and the internal compensating node of the operational amplifier 107. Switch $S_4$ is placed between the inverting input to the operational amplifier 107 and one terminal of the input capacitor $C_{IN}$. The voltage across the input capacitor $C_{IN}$ is the input signal $V_{IN}$. Finally, the positive input to operational amplifier is clamped at $V_{REF}$.

Figure 3:
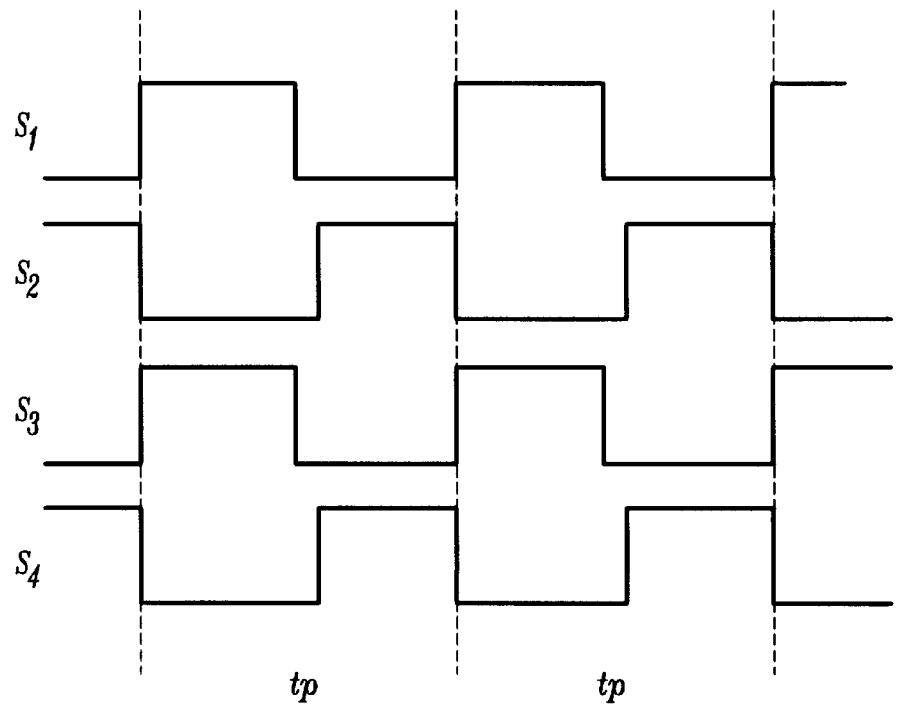
FIG. 3 is a timing diagram illustrating the operation of the amplifier shown in FIG. 2.

The operation of the charge amplifier 109 can best be understood with reference to FIGS. 2–3. As shown, FIG. 3 illustrates the timing of the switches $S_1$–$S_4$. It should be noted that timing circuitry of conventional design can implement the timing diagram of FIG. 3. Two timing cycles $t_p$ are shown. One timing cycle $t_p$ corresponds to the amplification of the signal from one pixel in the array. In the preferred embodiment, $t_p$ is approximately 175 nanoseconds.

During the first portion of a timing cycle $t_p$, switches $S_1$ and $S_3$ are in the closed position and switches $S_2$ and $S_4$ are in the open position. This position is referred to as the equalization position. The voltage at the output of the operational amplifier 107 and the inverting input are equalized at $V_{REF}$. Because switch $S_1$ is closed, a feedback loop is formed. This in turn requires that compensation capacitor $C_C$ be engaged via switch $S_3$.

Just before the midway point of timing cycle $t_p$, switches $S_1$ and $S_3$ are opened. Shortly thereafter, switches $S_2$ and $S_4$ are closed. In this configuration, called the amplification period, the input signal $V_{IN}$ is amplified by the operational amplifier 107 and provided as the output signal $V_{OUT}$. Note that during the amplification period, where switches $S_2$ and $S_4$ are closed, the compensation capacitor $C_C$ is disconnected.

The disconnection of the compensation capacitor $C_C$ during the amplification period is important because it allows the operational amplifier 107 to "settle" much more quickly. It can be appreciated by those skilled in the art that the settling time of an amplifier is directly related to the capacitances associated with the amplifier. By removing the compensation capacitor $C_C$ during the amplification period, an excessive capacitance at the internal node of the amplifying circuit is reduced, resulting in increased speed. Moreover, the compensation capacitor is unnecessary during the amplification period because the feedback capacitor $C_F$ and parasitic capacitors associated with the negative input serve to stabilize the feedback loop.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A fast settling amplifier for amplifying an input signal comprising:

an operational amplifier having a negative input, an output, and a compensation capacitor;

a feedback capacitor coupled between said negative input and said output;

a first switch connected between said negative input and said output;

a second switch between said output and a final output terminal;

a third switch for selectively disabling said compensation capacitor;

a fourth switch for selectively providing said input signal to said negative input; and a timing circuit operative in an equalization period to activate said first switch to bypass said feedback capacitor and said third switch to engage said compensation capacitor, said timing circuit operative in an amplification period to allow said input signal to be amplified by said operational amplifier with said compensation capacitor disengaged.

2. The amplifier of claim 1 wherein said input signal is carried by an input capacitor.

3. A method for amplifying an input signal by an amplifier, said amplifier including an operational amplifier having a negative input, an output, and a compensation capacitor and a feedback capacitor coupled between said negative input and said output, the method comprising the steps of:

(a) equalizing the voltage between said output and said negative input during an equalization period by bypassing said feedback capacitor with said compensation capacitor engaged; and (b) amplifying in an amplification period said input signal by providing said input signal to said negative input with said compensation capacitor disengaged.

\* \* \* \* \*